United States Patent
Sanchez et al.

(10) Patent No.: US 12,278,649 B2
(45) Date of Patent: Apr. 15, 2025

(54) PROCESSING DEVICE, TRANSMITTER, BASE STATION, MOBILE DEVICE, METHOD AND COMPUTER PROGRAM

(71) Applicant: Intel Corporation, Santa Clara, CA (US)

(72) Inventors: Ramon Sanchez, Galapagar MD (ES); Kameran Azadet, San Ramon, CA (US); Martin Clara, Santa Clara, CA (US); Daniel Gruber, St. Andrae (AT)

(73) Assignee: Intel Corporation, Santa Clara, CA (US)

( * ) Notice: Subject to any disclaimer, the term of this patent is extended or adjusted under 35 U.S.C. 154(b) by 704 days.

(21) Appl. No.: 17/358,131

(22) Filed: Jun. 25, 2021

(65) Prior Publication Data

US 2022/0416807 A1 Dec. 29, 2022

(51) Int. Cl.
 *H03M 1/88* (2006.01)
 *H03M 1/06* (2006.01)
 *H03M 1/18* (2006.01)
 *H04B 1/04* (2006.01)

(52) U.S. Cl.
 CPC ........... *H03M 1/88* (2013.01); *H03M 1/0612* (2013.01); *H03M 1/183* (2013.01); *H04B 1/04* (2013.01); *H04B 2001/0425* (2013.01)

(58) Field of Classification Search
 CPC ........ H03M 1/88; H03M 1/0612; H03M 1/83; H04B 1/04; H04B 2001/0245
 USPC .......................... 341/138, 155, 118, 120, 144
 See application file for complete search history.

(56) References Cited

U.S. PATENT DOCUMENTS

| | | | |
|---|---|---|---|
| 10,715,185 B1 | 7/2020 | Gruber et al. | |
| 12,003,225 B2 * | 6/2024 | Enzinger | H03H 21/0012 |
| 2015/0117869 A1 * | 4/2015 | Wakayama | H04B 10/5053 |
| | | | 398/185 |
| 2016/0197680 A1 * | 7/2016 | Li | H04B 10/2543 |
| | | | 398/194 |
| 2022/0182020 A1 * | 6/2022 | Yu | H04L 25/49 |

* cited by examiner

*Primary Examiner* — Peguy Jean Pierre
(74) *Attorney, Agent, or Firm* — 2SPL Patent Attorneys PartG mbB; Kieran O'Leary

(57) ABSTRACT

A processing device is provided. The processing device comprises one or more interfaces configured to transmit information to a nonlinear device and processing circuitry configured to control the one or more interfaces and to. Further, the processing circuitry is configured to transmit an excitation signal to the nonlinear device and to receive response information from the nonlinear device. Further, the processing circuitry is configured to determine a linear response of the nonlinear device based on the response information and to determine a nonlinear response of the nonlinear device based on the determined linear response.

19 Claims, 9 Drawing Sheets

PROCESSING DEVICE, TRANSMITTER, BASE STATION, MOBILE DEVICE, METHOD AND COMPUTER PROGRAM

FIELD

The present disclosure relates to the field of signal conversion. In particular, examples relate to a processing device, a method, a transmitter, a base station, a mobile device and a computer program.

BACKGROUND

Digital PreDistortion (DPD) is a digital technique mainly known for improving linearity of power amplifiers. Power amplifiers operate with better or more energy efficiency when a certain degree of nonlinearity is allowed—typically compression of the input signal (e.g., a smaller gain at higher amplitudes is allowed). The nonlinear input-output relationship changes the harmonic content of the signal.

DPD normally uses the input to a nonlinear device and an output, captured by a feedback. Based on the feedback a DPD function can be estimated. However, if the nonlinear device comprises a nonlinear response, with reduced memory, and a linear response, with very long memory the determining of the DPD function can be very complex and time consuming. Thus, there may be a need to improve a determination of a DPD function.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, e.g., only A, only B as well as A and B. An alternative wording for the same combinations is "at least one of the group A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
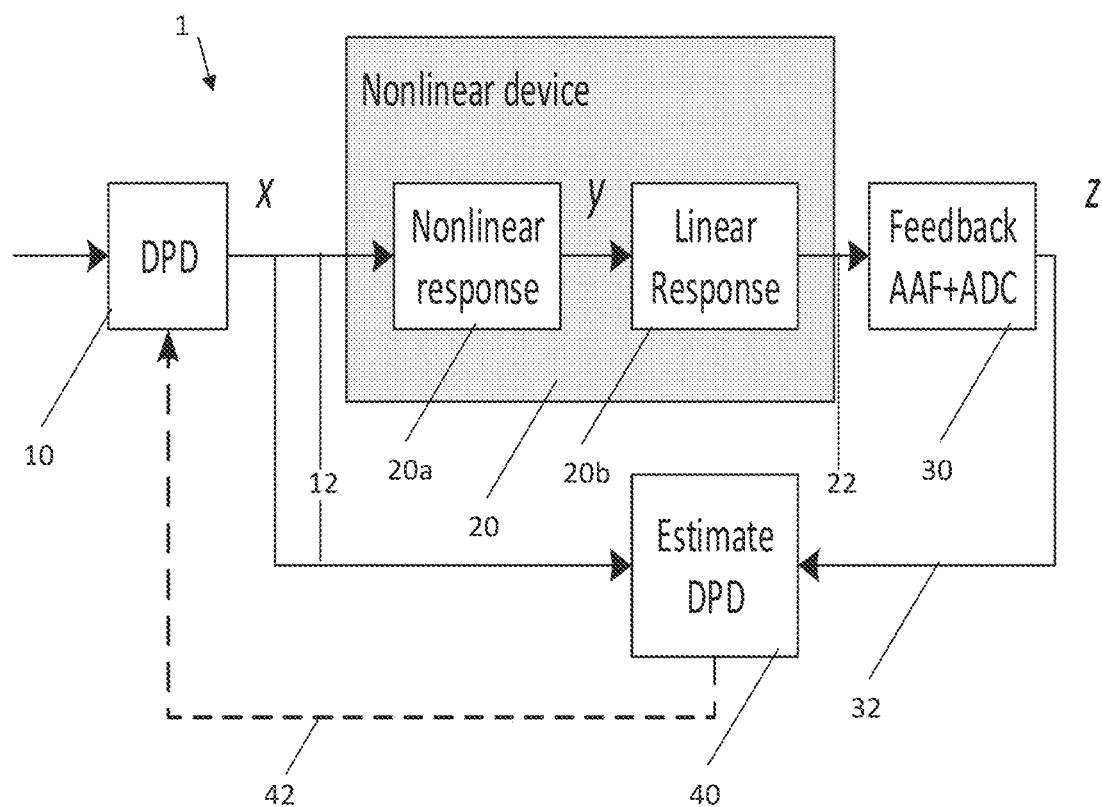
FIG. 1 shows an example of a digital-to-analog conversion system in the art.

FIG. 1 shows an example of a digital-to-analog conversion system 1 in the art. The digital-to-analog conversion system 1 comprises a nonlinear device 20, e.g., a DAC configured to receive an excitation signal 12 from a digital circuit 10 (e.g. a Digital Signal Processor, DSP). The excitation signal 12 (also referred as excitation function x(n)) leads to an impulse response 22 of the nonlinear device 20. The impulse response 22 can be transmitted to a feedback filter 30, e.g., a feedback filter 30 comprising an Analog-to-Digital Converter (DAC) and an antialiasing filter (AAF). The feedback filter 30 can provide a (digital) response information 32 (also referred as response function z(n)), which can be observed. The response information 32 and the excitation signal 12 can be used to calculate a predistortion function 42, e.g., using a functional estimation block 40. The predistortion function 42 can then be transmitted to the digital circuit 10. The predistortion function may then be used to mitigate the DAC nonlinearity.

To determine y for the generation of the predistortion function filtering of the signal z with the inverse of the linear response of the nonlinear device 20 is required. However, this would require a full rate feedback path, e.g., typically additionally to the ADC an AAF is comprised by the feedback filter 30 for this purpose. Thus, the determination of y in the art does not allow the use of a subsampled system, such like a subsampled ADC.

The theoretical background how a set of pre-distortion coefficients for generating the predistorted digital signal may be determined based on the sub-sampled digital feedback signal will be described in the following in short and can be found in the art, e.g., U.S. Pat. No. 10,715,185 B1 (incorporated by reference in its entirety). It is to be noted that the following mathematical description is for illustrative purposes only and does not limit the proposed architecture.

An excitation function x(n) is the input of the nonlinear device 20 and z(n) its output, a (e.g., nonlinear) distortion of the nonlinear device 20 and may be expressed as z(n)=F(x(n)). A function that corrects the nonlinearity and is applied to z(n), e.g., at the output of the nonlinear device 20, may be referred to as "post-distortion function". The post-distortion function would be such that x(n)=F$^{-1}$(z(n)), or equivalently x(n)=F$^{-1}$ (F(x(n))).

Pre-distortion is based in the fact that (under certain conditions) the post-distortion function F$^{-1}$ is valid if it is applied to the input of the nonlinear device 20, e.g., that x(n)=F(F$^{-1}$ (x(n))).

Therefore, a function F$^{-1}$ may be found such that x(n) =F$^{-1}$ (z(n)). This function may be used as a pre-distorter to generate a signal y(n)=F$^{-1}$ (x(n)) such that F(y(n))=x(n).

In practice, only an approximation of F$^{-1}$ may be found, usually by minimum mean square error (MMSE) of an error function e(n)=x(n)–F$^{-1}$ (z(n)).

If a nonlinear device 20 consists of a nonlinear part 20a with a nonlinear response, e.g., with reduced memory, followed by a linear part 20b with a linear response, with very long memory this may lead to very long impulse response 22 for estimating the predistortion function 42. For example, in the case of a wideband systems, e.g. wideband Radio Frequency (RF) sampling DAC, the linear response of the DAC consists of a very long impulse response. In the case of wideband systems this linear response can consist of many taps. If the digital circuit 10 uses the nonlinear device 20 input and output (from x to z) to determine its inverse nonlinear response to estimate the predistortion function 42, both linear 20b and nonlinear parts 20a are jointly compensated, which may result in a very complex system due to the long overall response. Thus, especially for wideband systems there may be a need to improve the determination of the DPD function.

More details and aspects are mentioned in connection with the examples described below. The example shown in FIG. 1 may comprise one or more optional additional features corresponding to one or more aspects mentioned in connection with the proposed concept or one or more examples described below (e. g. FIG. 2-11).

Figure 2:
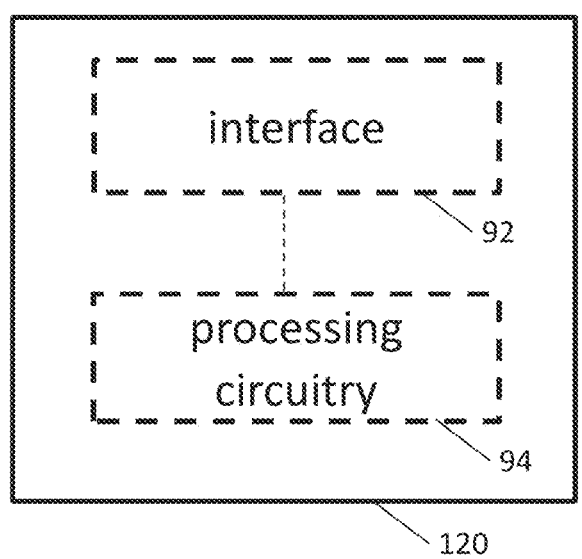
FIG. 2 shows a block diagram of an example of a processing device.

FIG. 2 shows a block diagram of an example of a processing device 120. The processing device 120 comprises one or more interfaces 92 configured to transmit information to a nonlinear device and processing circuitry 94 configured to control the one or more interfaces 92. Further, the processing circuitry 94 is configured to transmit an excitation signal to the nonlinear device and to receive response information from the nonlinear device and determine a linear response of the nonlinear device based on the response information. Further, the processing circuitry 94 is configured to determine a nonlinear response of the nonlinear device based on the determined linear response. Thus, the determination of the nonlinear response can be split into two parts. Firstly, the linear response is determined based on the response information and secondly the nonlinear response is determined based on the linear response. Therefore, the excitation signal can be selected to excite only the linear part of the nonlinear device, such that the response information only comprises information about the linear part. For example, the excitation signal may be chosen such that a nonlinear response of the nonlinear device can be neglected. Consequently, the response information may only comprise data about the linear response of the nonlinear device, leading to a shorter response time. Thus, the response information can be used solely to determine the linear response of the nonlinear device.

The response information can be described by a response function z(n). Thus, the processing circuitry 94 may receive the response function z(n), e.g., from the nonlinear device or a feedback filter. Based on the response function z(n) the processing circuitry can determine a linear response function h(n). The determination of the linear response function h(n) can be done in an analog way as known from the art for the nonlinear response, e.g., using MMSE.

Secondly, based on the linear response function h(n) a nonlinear response function y(n) can be determined. Thus, a complexity of the system can be reduced by determining the linear response function h(n) and the nonlinear response function y(n) separately leading to an improved determination of the nonlinear response, e.g., with shorter response time on the excitation signal.

In principle, the nonlinear response function y(n) can be determined independently and thus the linearity of the nonlinear device can be only compensated for the nonlinear response. This decreases the complexity of the system of the nonlinear device significantly, leading to a faster process of determining the nonlinear response of the nonlinear device. An excitation signal which is designed to excite the nonlinear parts of the nonlinear device may also excite the linear part of the nonlinear device. Thus, by exciting only the linear parts of the nonlinear device, the impulse response can be shortened, and the nonlinear response can be subsequently derived from the response information comprising the impulse response of the linear part.

The nonlinear response function y(n) can be derived from nonlinear mathematical models. Typical models often used to describe the behaviour of nonlinear systems are of the class known as "linear in parameters", of the form, $$y(n) = \sum_{k=0}^{K-1} a_k f_k(x),$$

where $a_k$ are constant parameters and $f_k(x)$ is a generic nonlinear function of the model input x={x(n)}. Each $f_k$ is usually known as a "basis function". Expressed in matrix form, y=F(x)a, the MMSE estimation is a=(F(x)$^T$F(x))$^{-1}$F(x)$^T$y.

Since no linear parts are included into y(n) the number of $a_k$ is significantly decreased in comparison to the art comprising both nonlinear and linear parts of the nonlinear device, leading to a less complex model for determining the nonlinear response function y(n). So in principle the parameters $a_k$ are decoupled from the linear part by the determination of h(n) based on the excitation signal.

The coefficients of the nonlinear model once the linear response has been determined can be derived as follows:

$$z(n) = y(n) * h(n),$$

$$z(n) = \left( \sum_{k=0}^{K-1} a_k f_k(x) \right) * h(n),$$

$$z(n) = \sum_{k=0}^{K-1} a_k (f_k(x) * h(n)),$$

$$g_k(x) = f_k(x) * h(n),$$

$$z(n) = \sum_{k=0}^{K-1} a_k g_k(x),$$

or in matrix form, z=G(x)a, and the MMSE estimation is a=(G(x)$^T$G(x))$^{-1}$G(x)$^T$z. For example, the basis functions $f_k(x)$ are replaced by the convolution of the linear response and the original basis functions $g_k(x)=f_k(x)*h(n)$ Thus, the nonlinear response function can be determined based on the excitation signal and the determined linear response. Such a feedback loop considering the nonlinear response and the linear response can be omitted leading to a decreased system complexity and a shorter response time.

In an example, the processing circuitry 94 may be further configured to determine a predistortion function based on the determined nonlinear response. The predistortion function can be used to improve the linearity of the nonlinear device. The determination of the predistortion function can be found in the art.

In an example, the processing circuitry 94 may be further configured to generate a pre-distorted digital signal based on the predistortion function and to transmit the pre-distorted digital signal to the nonlinear device to enable the nonlinear device to compensate nonlinear behavior. Thus, a linearity of the nonlinear device, e.g., a DAC, can be improved using DPD.

In an example, the excitation signal may be a small wideband signal. Thus, the nonlinear parts of the nonlinear device can be neglected.

The described processing device 120 enables the determination of the nonlinear response function for a nonlinear device without the need of a full rate feedback path. Further, this enables sub sampling, e.g., the use of a sub sampled ADC as described in more detail below, e.g., with reference to FIG. 3.

In an example, the processing circuitry 94 may be further configured to receive a training feedback signal for providing a feedback of the response of the nonlinear device to the processing device from a feedback device and wherein a transmission rate of the training feedback signal is lower than a transmission rate of the excitation signal. Thus, a DPD training can be performed with a subsampling.

In an example, the processing circuitry 94 may be further configured to receive a feedback signal for providing a feedback of the performance of the pre-distorted digital signal to the processing device from a feedback device and wherein a transmission rate of the feedback signal is lower than a transmission rate of the pre-distorted digital signal. For example, the (digital) feedback signal may comprise information about an observed nonlinearity of the nonlinear device. Thus, the feedback signal may indicate a performance of the pre-distorted digital signal, e.g., a mitigation of the nonlinear response. For example, the feedback signal may indicate the need of a generation of a new pre-distorted digital signal. Since the transmission rate of the feedback signal is lower as the transmission rate of the pre-distorted digital signal a subsampling can be applied. The feedback device may be an Analog-to-Digital Converter.

For example, every transmission of the nonlinear device to an environment, e.g., a transmission of an amplified RF signal, may lead to a generation of a feedback signal, which can be transmitted to the processing device 120. Thus, the processing device 120 may receive feedback signals at a feedback transmission rate corresponding to a transmission rate of the nonlinear device to the environment, e.g., a used radio frequency. A pre-distorted digital signal can be used for at least a plurality of transmission to the environment. Thus, a number of generated pre-distorted digital signals by the processing device is less than a number of received feedback signals. Therefore, the transmission rate of the pre-distorted signal can be less than the transmission rate of the feedback signal, leading to decreased resource consumption for determining pre-distorted signal. Especially, there may be no need for full rate feedback path enabling the use of subsampled devices.

As shown in FIG. 2 the respective one or more interfaces 92 are coupled to the respective processing circuitry 94 at the processing device 120. In examples the processing circuitry 94 may be implemented using one or more processing units, one or more processing devices, any means for processing, such as a processor, a computer or a programmable hardware component being operable with accordingly adapted software. Similar, the described functions of the processing circuitry 94 may as well be implemented in software, which is then executed on one or more programmable hardware components. Such hardware components may comprise a general-purpose processor, a Digital Signal Processor (DSP), a micro-controller, etc. The processing circuitry 94 is capable of controlling the interface 92, so that any data transfer that occurs over the interface and/or any interaction in which the interface may be involved may be controlled by the processing circuitry 94.

In an embodiment the processing device 120 may comprise a memory and at least one processing circuitry 94 operably coupled to the memory and configured to perform the below mentioned method.

In examples the one or more interfaces 92 may correspond to any means for obtaining, receiving, transmitting or providing analog or digital signals or information, e.g. any connector, contact, pin, register, input port, output port, conductor, lane, etc. which allows providing or obtaining a signal or information. An interface may be wireless or wireline and it may be configured to communicate, e.g., transmit or receive signals, information with further internal or external components. The one or more interfaces 92 may comprise further components to enable communication between vehicles. Such components may include transceiver (transmitter and/or receiver) components, such as one or more Low-Noise Amplifiers (LNAs), one or more Power-Amplifiers (PAs), one or more duplexers, one or more diplexers, one or more filters or filter circuitry, one or more converters, one or more mixers, accordingly adapted radio frequency components, etc.

More details and aspects are mentioned in connection with the examples described above and/or below. The example shown in FIG. 2 may comprise one or more optional additional features corresponding to one or more aspects mentioned in connection with the proposed concept or one or more examples described above (e. g. FIG. 1) and/or below (e. g. FIG. 3-11).

Figure 3:
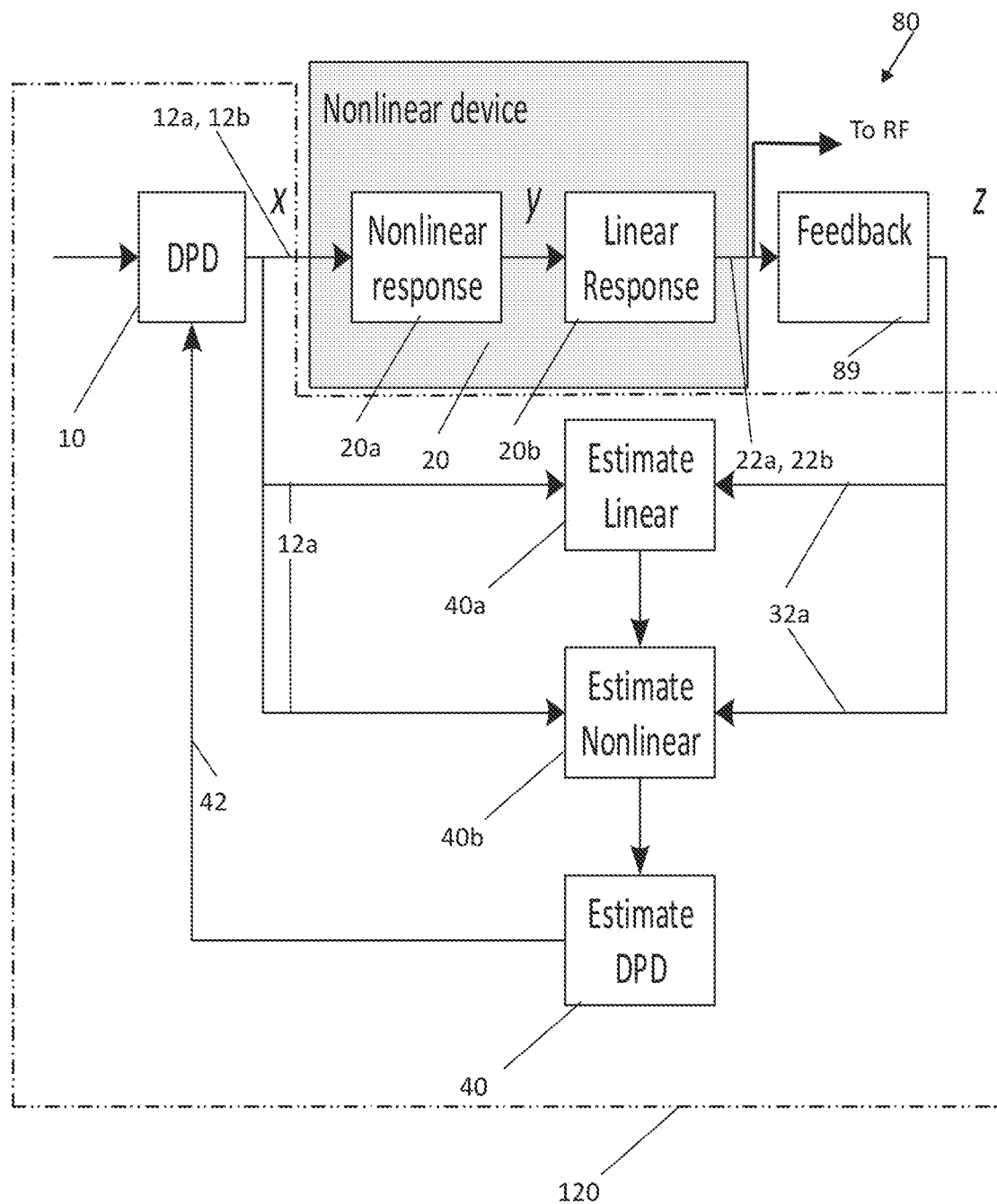
FIG. 3 shows an example of a digital-to-analog conversion system.

FIG. 3 shows an example of a digital-to-analog conversion system 80. The DAC system 80 comprises a nonlinear device 20, e.g., a DAC, which may be configured to receive the excitation signal 12a and/or a pre-distorted digital signal 12b (based on the predistortion function 42).

The excitation signal 12a leads to an impulse response 22a of the nonlinear device 20 and the pre-distorted digital signal 12b may be used by the nonlinear device 20 to generate an analog signal 22b, e.g., a RF signal for transmission to the environment.

The DAC system 80 may further comprise a feedback loop 89 for providing a digital feedback signal 32a, 32b to a processing device 120 (e.g., the processing device as described with reference to FIG. 2) of the DAC system 80. The feedback loop 89 may comprise a (subsampled) ADC (and optionally a filter) configured to generate the digital feedback signal 32a, 32b based on the analog signal 22a, 22b output of the nonlinear device 20.

To generate an improved analog signal 22b for transmission to the environment the predistortion function 42 has to be determined. For this, the excitation signal 12a may be transmitted to the nonlinear device 20. The excitation signal 12a may be a small wideband signal, such that the impulse response 22a only comprises information about linear parts 20b of the nonlinear device 20. The processing device 120 is provided with a (digital) feedback 32a of the excitation signal 12a. For example, the processing device 120 (e.g., the processing device described with reference to FIG. 2) may be configured to determine, based on the excitation signal 12a and the (digital) feedback signal 32a, a mathematical model for the linear response of the linear parts 20b of the nonlinear device 20 (indicated in FIG. 3 by means of a functional linear estimation block 40a).

For example, the processing device 120 (e.g., the processing device described with reference to FIG. 2) may be further configured to determine, based on the excitation signal 12a, the (digital) feedback signal 32a and the linear response a mathematical model for the nonlinear response of the nonlinear parts 20a of the nonlinear device 20 (indicated in FIG. 3 by means of a functional nonlinear estimation block 40b). With the knowledge about the nonlinear response of the nonlinear device 20 (indicated by y in FIG. 3) the predistortion function 42 can be determined by means of a functional DPD estimation block 40, which can be used to invert the response between (pre-distorted digital signal) 21b (indicated by x in FIG. 3) and the response of the nonlinear parts 20a of the nonlinear device 20 (indicated by y in FIG. 3).

The use of the processing device 120 enables the use of a subsampled device, e.g., a subsampled ADC, as mentioned above. Thus, a sampling rate of the ADC can be lower as a sampling rate of the DAC. The use of a subsampled ADC will be described in more detail below.

More details and aspects are mentioned in connection with the examples described above and/or below. The example shown in FIG. 3 may comprise one or more optional additional features corresponding to one or more aspects mentioned in connection with the proposed concept or one or more examples described above (e. g. FIGS. 1-2) and/or below (e. g. FIG. 4-11).

Figure 4:
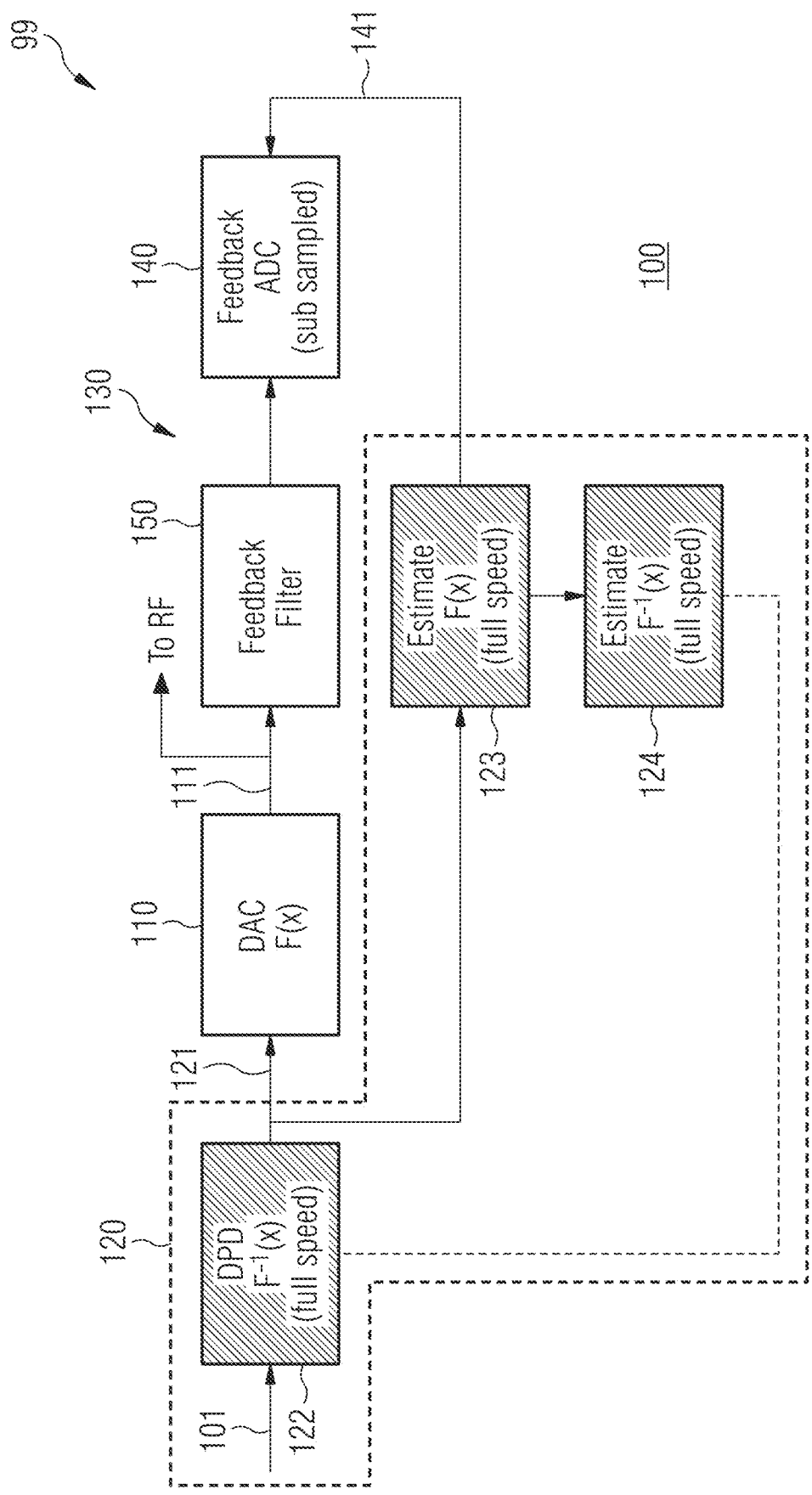
FIG. 4 illustrates a first example of a digital-to-analog conversion system.

FIG. 4 illustrates a transmitter 99 comprising a nonlinear system 100 and a processing device 120. The nonlinear system 100 comprises a nonlinear device 110 configured to receive a predistorted digital signal 121 from a processing device 120 (e.g. a Digital Signal Processor, DSP). The nonlinear device 110 is further configured to generate an analog signal 111 based on the pre-distorted digital signal 121. For example, the analog signal 111 may be a RF signal for transmission to the environment or an impulse response to an excitation signal, e.g., a small wideband signal.

The processing device 120 may be the processing device as described above, e.g., with reference to FIG. 2.

In an example, the nonlinear system 100 may be a digital-to-analog conversion system 100. The nonlinear device 110 may be a DAC 110. The digital-to-analog conversion system 100 further comprises a feedback loop 130 for providing a digital feedback signal 141 to the processing device 120 that enables the processing device 120 to train the DPD (algorithm). The feedback loop 130 comprises an Analog-to-Digital Converter (ADC) 140 configured to generate the digital feedback signal 141 based on the analog signal 111 output by the DAC 110. A sample rate of the ADC 140 is lower than a sample rate of the DAC 110. The sample rate of the DAC 110 denotes the rate at which the DAC 110 updates its analog output signal (such as the analog signal 111) based on digital input data (such as the pre-distorted digital signal 121). In other words, the sample rate of the DAC 110 denotes the rate at which the DAC 110 acquires digital input samples for updating its analog output signal. The sample rate of the ADC 140 denotes the rate at which the ADC 140 acquires (samples) an analog input signal (such as the analog signal 111). For example, the sample rate of the ADC 140 may be at least 5, 10, 20, 50, 100 or 200 times lower than the sample rate of the DAC 110. In other words, the feedback loop 130 uses a sub-sampled ADC for generating the digital feedback signal 141 for the processing device 120. For example, the ADC 140 may be a Successive Approximation Register (SAR) ADC, a flash ADC (also referred to as direct conversion ADC), a pipeline ADC, a sigma-delta ADC or a time-interleaved ADC.

Sampling the analog signal 111 of the DAC 110 at a (significantly) lower rate may allow to generate a digital feedback that enables the processing device 120 to train the DPD. Compared to conventional approaches, no high-speed/full-speed ADC running at the sample rate of the DAC 110 is required. The sub-sampled ADC 140 may exhibit reduced complexity, (die) size, costs and power consumption compared to a high-speed/full-speed ADC running at the sample rate of the DAC 110.

As said above, the processing device 120 may train the DPD using the sub-sampled digital feedback signal 141 exhibiting a lower sample rate the pre-distorted digital signal 121. For example, the processing device 120 may be configured to determine, based on the pre-distorted digital signal 121 and the digital feedback signal 141, a mathematical model of a transfer function of the DAC 110 when operating at a maximum value of the sample rate (indicated in FIG. 4 by means of functional estimation block 123). Further, the processing device 120 may be configured to determine, based on the mathematical model of the transfer function of the DAC 110, a set of pre-distortion coefficients (indicated in FIG. 4 by means of functional estimation block 124). The processing device 120 may use the set of pre-distortion coefficients for generating the pre-distorted digital signal 121 based on a digital signal 101 (indicated in FIG. 4 by means of functional DPD block 121).

The pre-distorted digital signal 121 may be determined as described with reference to FIG. 2 using a small wideband signal as excitation function to excite solely the linear parts of the DAC. Based on the response information comprising the linear parts of the DAC the nonlinear response of the DAC can be derived as described above.

The theoretical background how a set of pre-distortion coefficients for generating the predistorted digital signal 121 may be determined based on the sub-sampled digital feedback signal 141 will be described in the following. It is to be noted that the following mathematical description is for illustrative purposes only and does not limit the proposed architecture.

If $x(n)$ is the input of the DAC 110 and $z(n)$ its output, a (e.g. nonlinear) distortion of the DAC output may be expressed as $z(n)=F(x(n))$. A function that corrects the nonlinearity and is applied to $z(n)$, e.g., at the output of the DAC 110, may be referred to as "post-distortion function". The post-distortion function would be such that $x(n)=F^{-1}(z(n))$, or equivalently $x(n)=F^{-1}(F(x(n)))$.

Pre-distortion is based in the fact that (under certain conditions) the post-distortion function $F^{-1}$ is valid if it is applied to the input of the DAC 110, e.g., that (n)=F(F$^{-1}$(x(n))).

Therefore, a function $F^{-1}$ may be found such that x(n)= $F^{-1}$(z(n)). This function may be used as a pre-distorter to generate a signal y(n)=$F^{-1}$(x(n)) such that F(y(n))=x(n).

In practice, only an approximation of $F^{-1}$ may be found, usually by minimization of the Mean Square Error (MSE) of an error function e(n)=x(n)−$F^{-1}$(z(n)).

The nonlinear mathematical models more often used to describe the behaviour of both F and $F^{-1}$ are of the class known as "Linear in Parameters", of the form $$z(n)=\Sigma_{k=0}^{K-1} a_k g_k(x(n-l), \ldots, x(n+m)) \quad (1)$$

$a_k$ denotes constant parameters and g(n−l), . . . , x(n+m)) denotes a nonlinear function of the model input samples. The models of this type have the advantage of being easy to optimize by MSE techniques and are therefore very commonly used.

Mathematical expression (1) may be expressed in matrix form:

$$z=G(x)a \quad (2)$$

Using the following abbreviations:

$$z=(z(1)z(2) \ldots z(N))^T \quad (3)$$

$$a=(a_0 a_1 \ldots a_K)^T \quad (4)$$

and $$G(x) = \begin{pmatrix} g_0(x(1-l), \ldots, x(1+m)) & \ldots & g_{K-1}(x(1-l), \ldots, x(1+m)) \\ \ldots & \ldots & \ldots \\ g_0(x(N-l), \ldots, x(N+m)) & \ldots & g_{K-1}(x(N-l), \ldots, x(N+m)) \end{pmatrix} \quad (5)$$

The MSE solution is given by $$a=(G(x)^T G(x))^{-1} G(x)^T z \quad (6)$$

This type of model may be used for both z(n)=F(x(n)) and x(n)=$F^{-1}$(z(n)). The fundamental reason that allows for the subsampled ADC 140 is that mathematical expression (6) is also valid if the output samples of the system that is being modelled are not selected consecutive, e.g., $$z=(z(i_1)z(i_2) \ldots z(i_N))^T \quad (7)$$

wherein the values $i_n$ are not consecutive (subsampled) in mathematical expression (7), and $$G(x) = \begin{pmatrix} g_0(x(i_1-l), \ldots, x(i_1+m)) & \ldots & g_{K-1}(x(i_1-l), \ldots, x(i_1+m)) \\ \ldots & \ldots & \ldots \\ g_0(x(i_N-l), \ldots, x(i_N+m)) & \ldots & g_{K-1}(x(i_N-l), \ldots, x(i_N+m)) \end{pmatrix} \quad (8)$$

It may be concluded from mathematical expressions (7) and (8) that the observed set of samples at the output of the nonlinearity z does not require to be a set of consecutive samples. In contrast the input x demands to be a set of consecutive samples, since the values in x(n−l), . . . , x(n+m) are a set of consecutive samples.

As a consequence, the direct model of the ADC 110, where the input is the known DAC input x(n) and the output is the ADC output, can be calculated with an arbitrarily set of samples $z(i_1) z(i_2) \ldots z(i_N)$.

If the same MSE method was used to directly estimate the inverse nonlinearity x(n)=$F^{-1}$(z(n)), the MSE solution would be given by $$a=(G(z)^T G(z))^{-1} G(z)^T x \quad (9)$$

Mathematical expression (9) would require a consecutive sets of samples of the form z(n−l), . . . , z(n+m) only available if the ADC is running at full sample rate.

For example, the processing device 120 may first estimate (determine) the (e.g. nonlinear DAC) model z(n)=F(x(n)) based on the sub-sampled set of DAC outputs (captured using the sub-sampled ADC 140). Once the direct model of the DAC 110 is available, the processing device 120 may estimate (determine) a full set of consecutive DAC output samples based on the complete set of successive DAC input samples. The processing device 120 then may estimate (determine) a G (z) matrix and calculate the inverse of the DAC nonlinearity, e.g., the DPD function, based on the full set of DAC outputs.

In the example of FIG. 4, the feedback loop 130 further comprises a filter 150 that is coupled between the DAC 110 and the ADC 140. The filter 150 exhibits a fix (unchangeable, non-tunable) cutoff frequency. In other words, the cutoff frequency is independent from an instantaneous value of the sample rate of the DAC 110. The filter 150 may, e.g., be used for anti-alias-filtering the analog signal 111 before the ADC 140 samples the analog signal 111. For example, the cutoff frequency of the filter 150 may be equal to half of a maximum value of the sample rate of the DAC 110 so that signal energy at frequencies above half of the maximum value of the sample rate is removed from the analog signal 111. In order to be capable of processing the filtered analog signal 111 simultaneously along its entire bandwidth, an input bandwidth of the filter 150 may be equal to or higher than half of a maximum value of the sample rate of the DAC 110. Similarly, an input bandwidth of the ADC 140 may be equal to or higher than half of a maximum value of the sample rate of the DAC 110.

In order to ensure that the above mentioned selection of samples $z(i_1) z(i_2) \ldots z(i_N)$ taken by the ADC 140 covers the full range of DAC output amplitudes so that it is representative of the behaviour of the DAC 110 at different amplitudes, the set of sampling points $i_1, i_2, \ldots i_N$ may be irregularly spaced. This will become more evident from the following description of FIG. 5.

More details and aspects are mentioned in connection with the examples described above and/or below. The example shown in FIG. 4 may comprise one or more optional additional features corresponding to one or more aspects mentioned in connection with the proposed concept or one or more examples described above (e. g. FIGS. 1-3) and/or below (e. g. FIG. 5-11).

Figure 5:
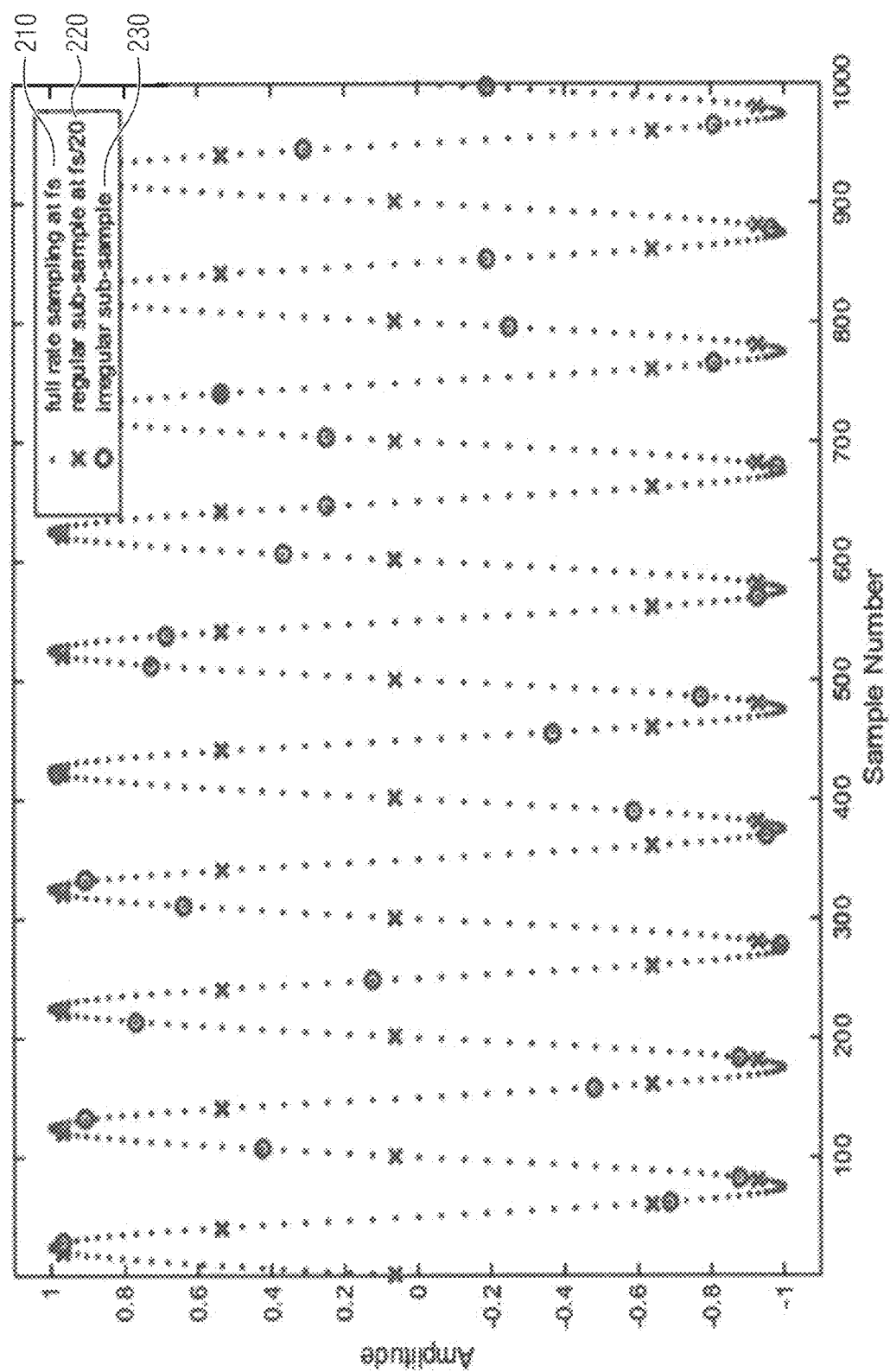
FIG. 5 illustrates an example of a signal sampled with different sample settings.

In FIG. 5, it is assumed that the DAC 110 outputs a sinusoidal analog signal. As a reference, samples 210 taken by an ADC at a sample rate that is equal to the maximum value of the sample rate of the DAC 110 are illustrated. The samples 210 replicate well the sinusoidal shape of the analog signal.

Further, samples 220 and 230 are illustrated. The samples 220 and 230 are taken by ADC 140 for two different sample settings. The samples 220 are taken by the ADC 140 at a sample rate that is 1/20 of the maximum value of the sample rate of the DAC 110. The samples 220 are taken at regular (constant, unchanged) time intervals. As can be seen from FIG. 5, the sinusoidal analog signal is always sampled at one of only five different amplitudes. Therefore, the samples 220 do not cover the full range of DAC output amplitudes. In other words, the samples 220 are de facto not representative of the behaviour of the DAC 110 at different amplitudes.

On the other hand, the 230 are taken at irregular (altered, changed) time intervals. It can be seen from FIG. 5, that the sinusoidal analog signal is sampled at many different amplitudes. Therefore, the samples 230 substantially cover the full range of DAC output amplitudes so that the samples 230 are representative of the behaviour of the DAC 110 at different amplitudes.

In the example of FIG. 5, the ADC 100 may, hence, be configured to sample the analog signal 111 at irregular (varying) time intervals such that the sample rate of the ADC 140 is (remains) constant on average. The ADC 140 may be controlled in many ways such that it samples the analog signal 111 at irregular time intervals. In the following, two exemplary implementations are described. However, the ADC 140 is not limited to those implementations.

For example, the ADC 140 may be configured to receive a clock signal and count a number of clock cycles of the clock signal. Further, the ADC 140 may be configured to sample the analog signal every time the number of clock cycles is equal to a stored value. After sampling the analog output signal, the ADC 140 may be configured update the stored value. By updating the stored value, the number of clock cycles between two sampling events may be effectively varied. For example, the number of clock cycles may be varied between 48 and 64 by incrementing the stored value after sampling the analog output signal, or by setting the stored value to a new random value between 48 and 64 after sampling the analog output signal.

In other examples, the digital-to-analog conversion system 100 may, e.g., further comprise a clock divider circuit (not illustrated) configured to receive a first clock signal and to divide the first clock signal with varying division factors in order to generate a second clock signal with varying clock cycles for the ADC 140. The ADC 140 may be configured to sample the analog signal 111 based on the second clock signal so that it samples the analog signal 111 at irregular time intervals.

In the example of FIG. 5, the sinusoidal analog signal exhibits a constant signal shape, e.g., the shape of the sinusoidal analog signal does not change with time. For analog signals exhibiting a substantially constant signal shape, irregular sampling may be used to acquire samples that are representative of the behaviour of the DAC 110 at different amplitudes.

If the analog signal sampled by the DAC 140 varies enough, regular sampling may be sufficient. For example, if the analog signal is not sinusoidal but with varying phase or if the frequency of the analog signal is not a multiple of the sampling rate, regular sampling may be sufficient. In other words, the ADC 140 may, in some alternative examples, be configured to sample the analog output signal 211 at regular (constant) time intervals.

For example, the ADC 140 may be capable of sampling the analog output signal at regular time intervals and at irregular time intervals. If a control signal received by the ADC 140 indicates that the analog output signal 111 exhibits a predetermined signal condition, the ADC 140 may be configured to sample the analog output signal 111 at regular time intervals. On the other hand, if the control signal indicates that the analog output signal 111 exhibits another predetermined signal condition, the ADC 140 may be configured to sample the analog output signal 111 at irregular time intervals.

Information about the signal conditions of the analog output signal 111 may, e.g., be available at the processing device 120. Accordingly, the control signal for adjusting the sample behavior of the ADC 140 may, e.g., be supplied to the ADC 140 by the processing device 120 (or a baseband circuit coupled to the digital-to-analog conversion system 100).

More details and aspects are mentioned in connection with the examples described above and/or below. The example shown in FIG. 5 may comprise one or more optional additional features corresponding to one or more aspects mentioned in connection with the proposed concept or one or more examples described above (e. g. FIGS. 1-4) and/or below (e. g. FIG. 6-11).

Figure 6:
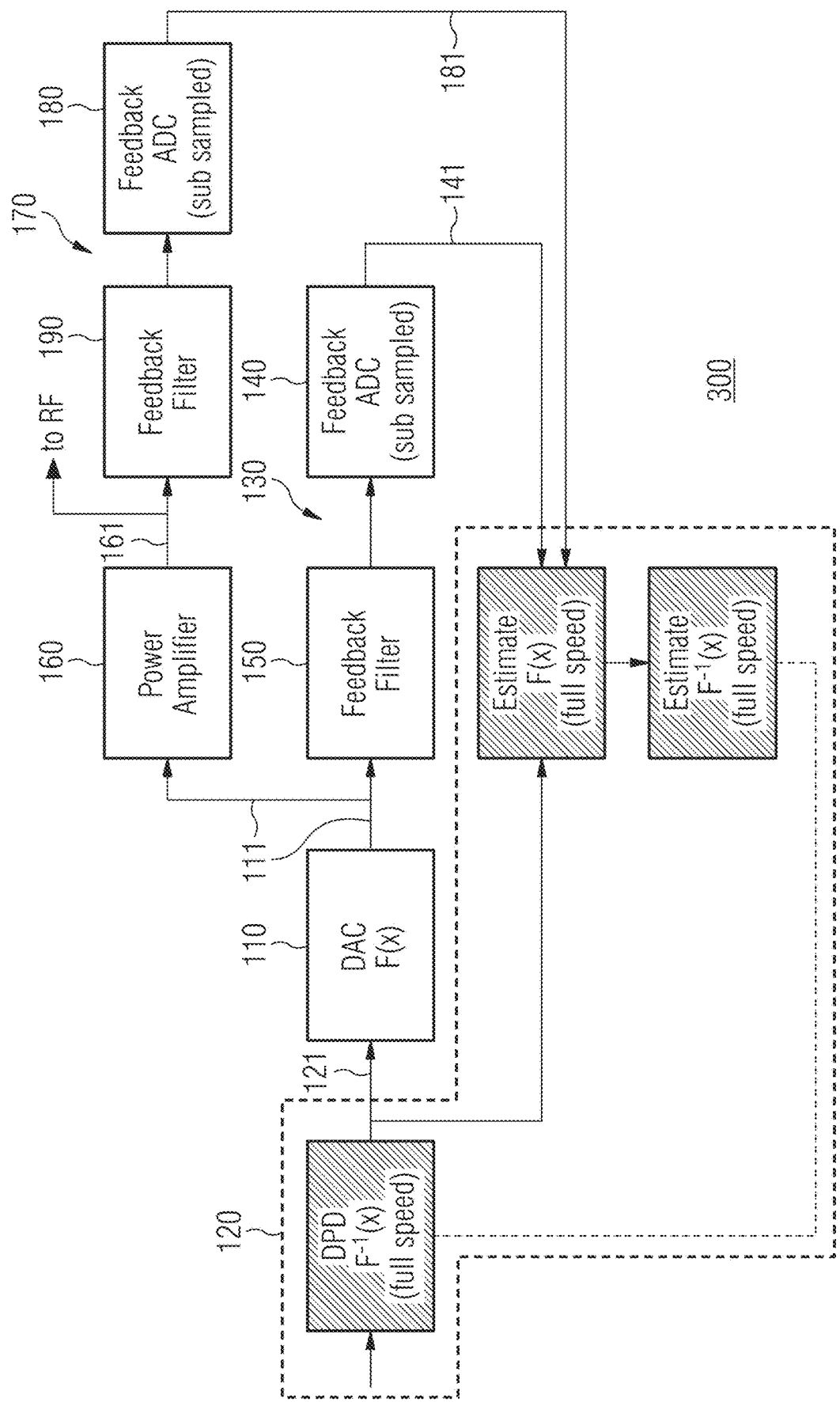
FIG. 6 illustrates a second example of a digital-to-analog conversion system.

In some examples, the digital-to-analog conversion system may further comprise a PA for amplifying the DAC output. An exemplary digital-to-analog conversion system 300 is illustrated in FIG. 6. Digital-to-analog conversion system 300 is substantially similar to the digital-to-analog conversion system 100 described above. Therefore, it is mainly referred to the differences between both digital-to-analog conversion systems.

In comparison to the digital-to-analog conversion system 100, the digital-to-analog conversion system 300 additionally comprises a Power Amplifier (PA) 160 coupled to the DAC 110 and configured to amplify the analog signal 111 for generating an amplified signal 161 (e.g. an amplified RF transmission signal).

As described above, DPD may be used to compensating the nonlinearity of PAs. In order to additionally train the DPD for the nonlinearities of the PA 160, the digital-to-analog conversion system 300 comprises a second feedback loop 170 in addition to feedback loop 130.

The second feedback loop 170 is for providing a second digital feedback signal 181 to the processing device 120. The second feedback loop 170 comprises a second ADC 180 configured to generate the second digital feedback signal 181 based on the amplified signal 161 output by the PA 160. A sample rate of the second ADC 180 is lower than a sample rate of the DAC 110. For example, the ADCs 140 and 180 may operate at the same sample rate.

Further, the second feedback loop 170 comprises a second filter 190 with the fix cutoff frequency. The second filter 190 is coupled between the PA 160 and the second ADC 180. In other words, also the output of the PA 160 is sub sampled in order to provide a feedback for DPD training. The second feedback loop 170 may be implemented substantially similar to the feedback loop 130. For example, individual components of the second feedback loop 170 (e.g. the filter 190) may be configured in an equivalent manner as their counterparts in the feedback loop 130 (e.g. the filter 150).

Similar to what is described above, the processing device 120 may be configured to determine, based on the pre-distorted digital signal 121 and the second digital feedback signal 181, a mathematical model of a transfer function of the PA 160. The processing device 120 may, similar to the above explanations, be configured to determine the set of pre-distortion coefficients for generating the pre-distorted digital signal 121 further based on the mathematical model of the transfer function of the PA 160.

Accordingly, a low cost, low (die) area and low power feedback path circuitry for a combined system of a DAC and a PA may be provided that enables to train a DPD function for compensating (mitigating) the nonlinear behavior of the DAC and the PA.

In the examples described above in connection with FIGS. 1 to 3, it was assumed that the sample rate of the pre-distorted digital signal 121 is equal to the maximum value of the sample rate of the DAC 110, e.g., that the DAC 110 is operating at its maximum sample rate. However, the proposed architecture may be used for any sample rate of the DAC. An according exemplary digital-to-analog conversion system 400 is illustrated in FIG. 7.

More details and aspects are mentioned in connection with the examples described above and/or below. The example shown in FIG. 6 may comprise one or more optional additional features corresponding to one or more aspects mentioned in connection with the proposed concept or one or more examples described above (e. g. FIGS. 1-5) and/or below (e. g. FIG. 8-11).

Figure 7:
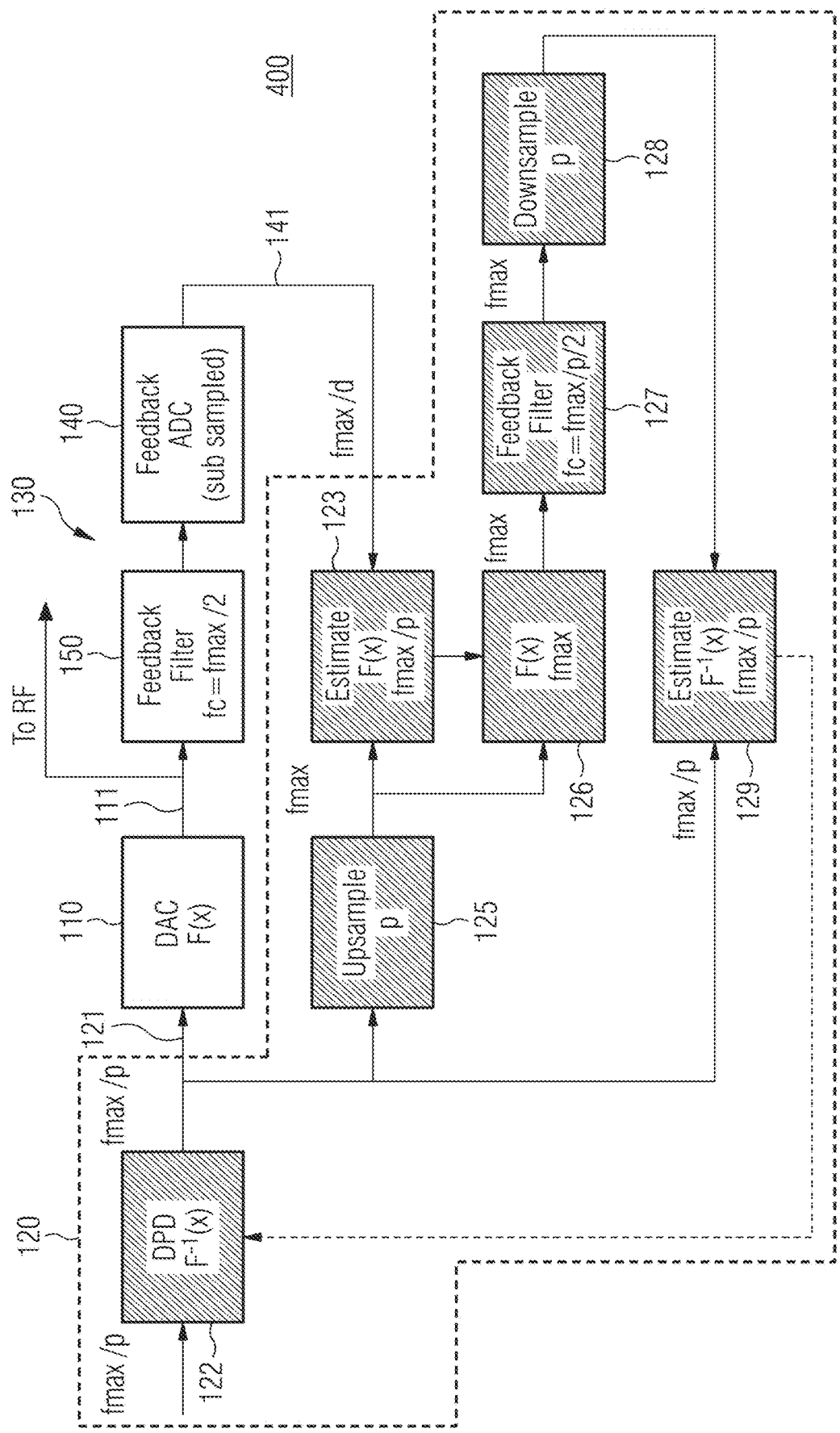
FIG. 7 illustrates a third example of a digital-to-analog conversion system.

In the example of FIG. 7, the instantaneous (current) sample rates of the pre-distorted digital signal 121 and the DAC 110 are lower than the maximum value of the sample rate of the DAC 110. The sample rates of the pre-distorted digital signal 121 and the DAC 110 are $f_{max}/p$, e.g., a p-th of the maximum value of the sample rate of the DAC 110.

The sample rate of the ADC 140 is again lower the instantaneous sample rate of the DAC 110, e.g., the sample rate of the ADC 140 is lower than $f_{max}/p$. The cutoff frequency of the filter 150 is again fixed to half of the maximum value of the sample rate of the DAC 110, e.g., to $f_{max}/2$. Further, the bandwidth of the filter 150 equal to of the maximum value of the sample rate of the DAC 110.

An advantage of the proposed architecture is that once the direct model of the ADC has been estimated at the maximum supported rate, the anti-alias filtering, down-sampling and inverse nonlinearity $F^{-1}(z(n))$ may be implemented in the digital domain. Therefore, a single feedback filter with a bandwidth equal to the maximum frequency of operation, $f_{max}/2$ may be used. This will be described in the following with more details.

The processing device 120 is configured to up-sample the pre-distorted digital signal from its instantaneous sample rate $f_{max}/p$ to the maximum value of the sample rate $f_{max}$ of the DAC 110 in order to generate an up-sampled pre-distorted digital signal (indicated in FIG. 7 by means of functional upsampling block 125). The up-sampled pre-distorted digital signal exhibits the sample rate $f_{max}$.

Further, the processing device 120 is configured to determine the mathematical model of the transfer function of the DAC 110 when operating at a maximum value of the sample rate based on the up-sampled pre-distorted digital signal and the digital feedback signal 141 (indicated in FIG. 7 by means of functional estimation block 123). In other words, the processing device 120 determines the mathematical model as described above for the DAC 110 operating a maximum sample rate by using the up-sampled pre-distorted digital signal instead of the pre-distorted digital signal at the lower sample rate $f_{max}/p$ The processing device is configured to subsequently determine, based on the mathematical model and the up-sampled pre-distorted digital signal, an auxiliary feedback signal (indicated in FIG. 7 by means of functional feedback block 126). The auxiliary feedback signal exhibits a sample rate equal to the maximum value of the sample rate of the digital-to-analog converter. The auxiliary feedback signal represents a simulated output of the ADC 140 if the ADC 140 was operated at the maximum value of the sample rate of the DAC 110. Due to the knowledge about the DAC behavior (described by the mathematical model) and the pre-distorted digital signal 121, the DAC output at the maximum value of the sample rate of the digital-to-analog converter may be estimated. Since the up-sampled pre-distorted digital signal and the auxiliary feedback signal are at the same higher sample rate, the inverse nonlinearity of the DAC 110 at lower sample rate may be directly estimated.

Therefore, the processing device 120 is further configured to filter the auxiliary feedback signal with a cutoff frequency equal to half of the sample rate of the pre-distorted digital signal, e.g., cutoff frequency equal to $f_{max}/2p$ (indicated in FIG. 7 by means of functional filter block 127).

Further, the processing device 120 is configured to down-sample the auxiliary feedback signal after filtering to obtain a down-sampled auxiliary feedback signal exhibiting the sample rate of the pre-distorted digital signal 121, e.g., exhibiting a sample rate of $f_{max}/p$ (indicated in FIG. 7 by means of functional downsampling block 128).

Finally, the processing device 120 is further configured to determine, based on the pre-distorted digital signal and the down-sampled auxiliary feedback signal, a set of pre-distortion coefficients for generating the pre-distorted digital signal 121 (indicated in FIG. 7 by means of functional estimation block 128). For example, the pre-distortion coefficients for generating the pre-distorted digital signal may be determined by solving the above mathematical expression (13).

The processing device 120 may use the set of pre-distortion coefficients for generating the pre-distorted digital signal 121 at the sample rate $f_{max}/p$.

It is evident from the above description that the feedback loop 130 may be operated independent from the sample rate of the pre-distorted digital signal 121 and/or the sample rate of the DAC 110. That is, the proposed feedback loop 130 may enable a high flexibility with respect to the used sample rates. In particular, the same filter 150 may be used for any sample rate of the pre-distorted digital signal 121 and/or the DAC 110 up to the maximum sample rate of the DAC 110.

Similar to what is described above, the digital-to-analog conversion system 150 may optionally further comprise a PA and a second feedback loop as described above in connection with FIG. 6. Based on the pre-distorted digital signal 121 and the feedback signals of both feedback loops, a mathematical model of the transfer functions of the DAC 110 and the PA at the maximum value of the sample rate of the DAC 110 may be determined similar to what is described above in connection with FIG. 7. A set of pre-distortion coefficients for generating the predistorted digital signal 121 may be determined based on the mathematical model of the transfer functions.

More details and aspects are mentioned in connection with the examples described above and/or below. The example shown in FIG. 7 may comprise one or more optional additional features corresponding to one or more aspects mentioned in connection with the proposed concept or one or more examples described above (e. g. FIGS. 1-6) and/or below (e. g. FIG. 8-11).

Figure 8:
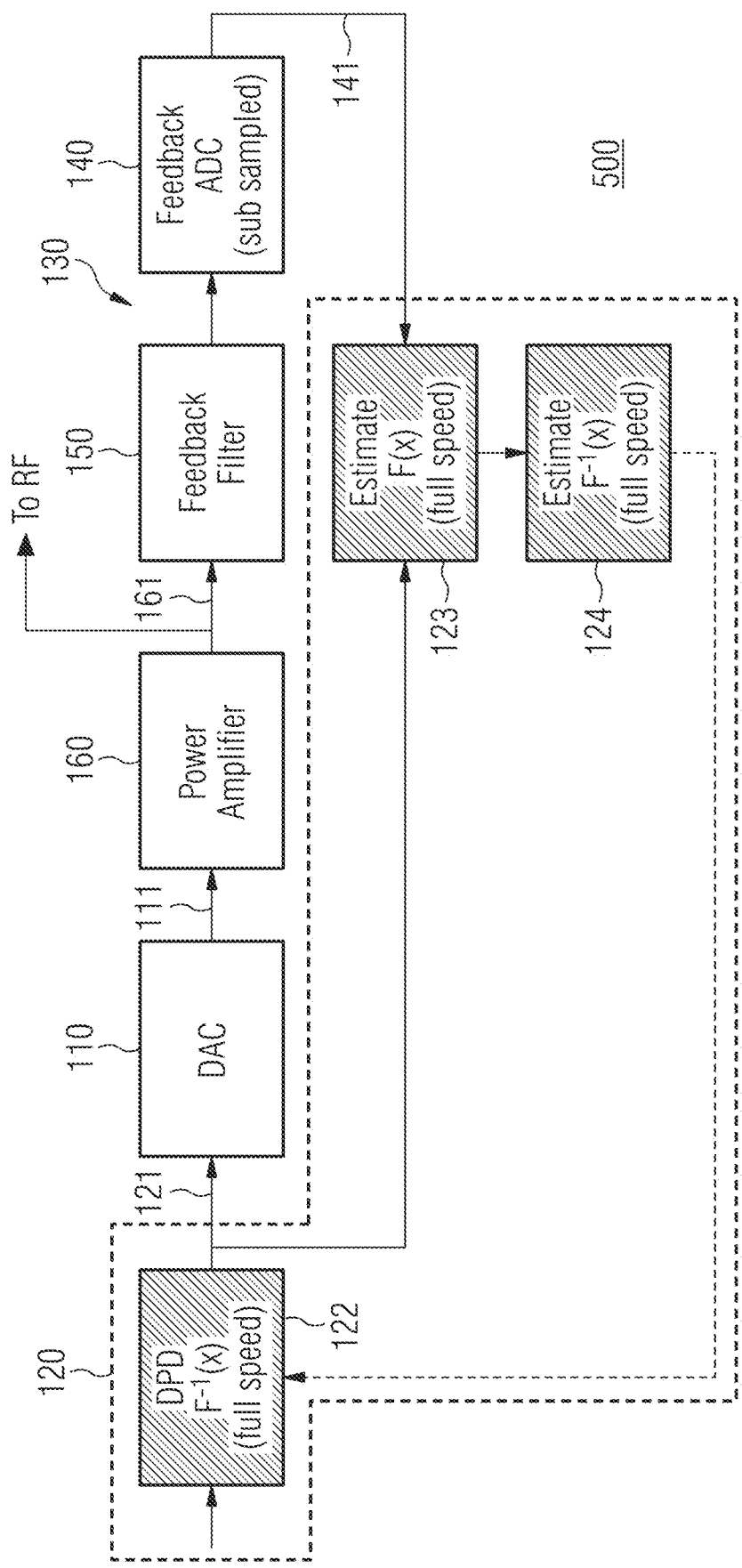
FIG. 8 illustrates a fourth example of a digital-to-analog conversion system.

Another example of a feedback loop for a combination of a DAC and a PA is illustrated in FIG. 8. FIG. 8 illustrates digital-to-analog conversion system 500 comprising a DAC 110 and PA 160. The DAC 110 is configured to receive a pre-distorted digital signal 121 from a processing device 120, and to generate an analog signal 111 based on the pre-distorted digital signal 121. The PA 160 is coupled to the DAC 110 and configured to amplify the analog signal 111 for generating an amplified signal 161.

Also the digital-to-analog conversion system 500 comprises a feedback loop 130 for providing a digital feedback signal 141 to the processing device 120 such that the processing device 120 may train the DPD.

The feedback loop 130 comprises an ADC 140 configured to generate the digital feedback signal 141 based on the amplified signal 161. A sample rate of ADC 140 is lower than a sample rate of the DAC 110. In other words, the amplified signal 161 is subsampled by the ADC 140.

The feedback loop 130 further comprises a filter 150 with a fix cutoff frequency. The filter 150 is coupled between the PA 160 and the ADC 140. The feedback loop of the digital-to-analog conversion system 500 may be implemented substantially similar to the above described feedback loops of the digital-to-analog conversion system 100 to 400. Individual components of the feedback loop of the digital-to-analog conversion system 500 may be implemented/configured as described above. For example, the cutoff frequency of the filter 150 may be independent from an instantaneous value of the sample rate of the DAC 110, or the ADC 140 may be configured to sample the amplified signal 161 at irregular time intervals such that the sample rate of the ADC 140 is (remains) on average constant.

Similar to what is described above individually for DACs and PAs, the processing device 120 is configured to determine, based on the pre-distorted digital signal 121 and the digital feedback signal 141, a common mathematical model of transfer functions of the DAC 110 and the PA 160 (indicated in FIG. 8 by means of functional estimation block 123).

The processing device 120 is further configured to determine, based on the mathematical model, a set of pre-distortion coefficients for generating the pre-distorted digital signal 121 in accordance with the above explanations (indicated in FIG. 8 by means of functional estimation block 124).

In the example of FIG. 8, it is again assumed that the sample rate of the pre-distorted digital signal 121 and the DAC 110 are at the maximum value of the sample rate of the DAC. However, it is to be noted that for lower sample rates, the processing in the digital domain as described above in connection with FIG. 7 may be used accordingly.

The digital-to-analog conversion system 500 may be understood as combined system of a DAC and a PA with a low cost, low (die) area and low power feedback path circuitry that enables to train a DPD function for compensating (mitigating) the nonlinear behavior of the DAC and the PA.

The examples described above in connection with FIGS. 1 to 5 may enable a wideband DAC DPD training using the (e.g. irregularly) sub-sampled ADC.

When the exemplary digital-to-analog conversion systems described above in connection with FIGS. 1 to 5 are initialized and no DPD coefficients are yet available, the DPD may be bypassed or give a trivial response (e.g. output is identical to input). If the DPD is bypassed, the above mentioned "pre-distorted digital signal" supplied to the DAC 110 is the bypassed signal provided by the processing device 120 to the DAC 110.

Figure 9:
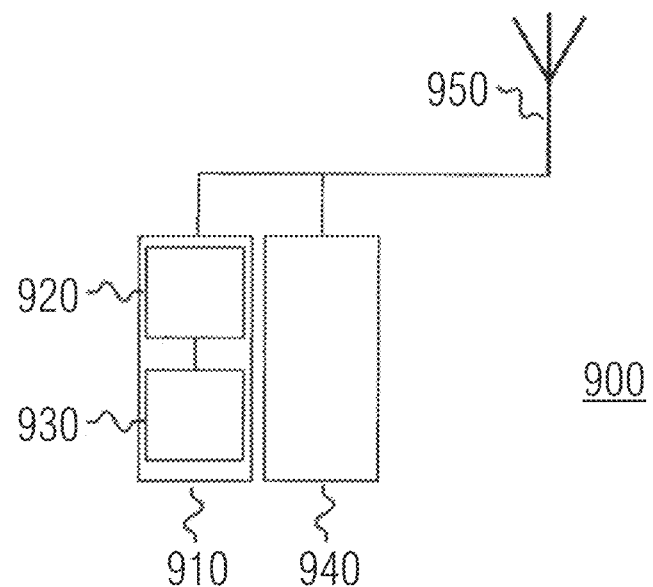
FIG. 9 illustrates an example of a base station.
Figure 10:
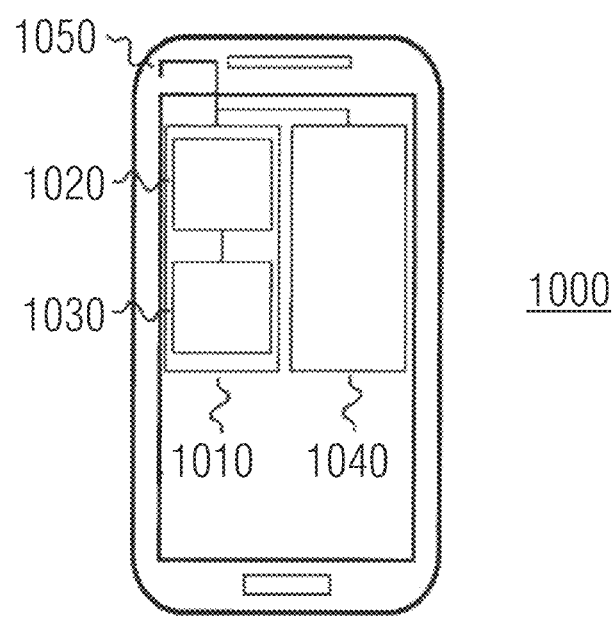
FIG. 10 illustrates an example of a mobile device.
Figure 11:
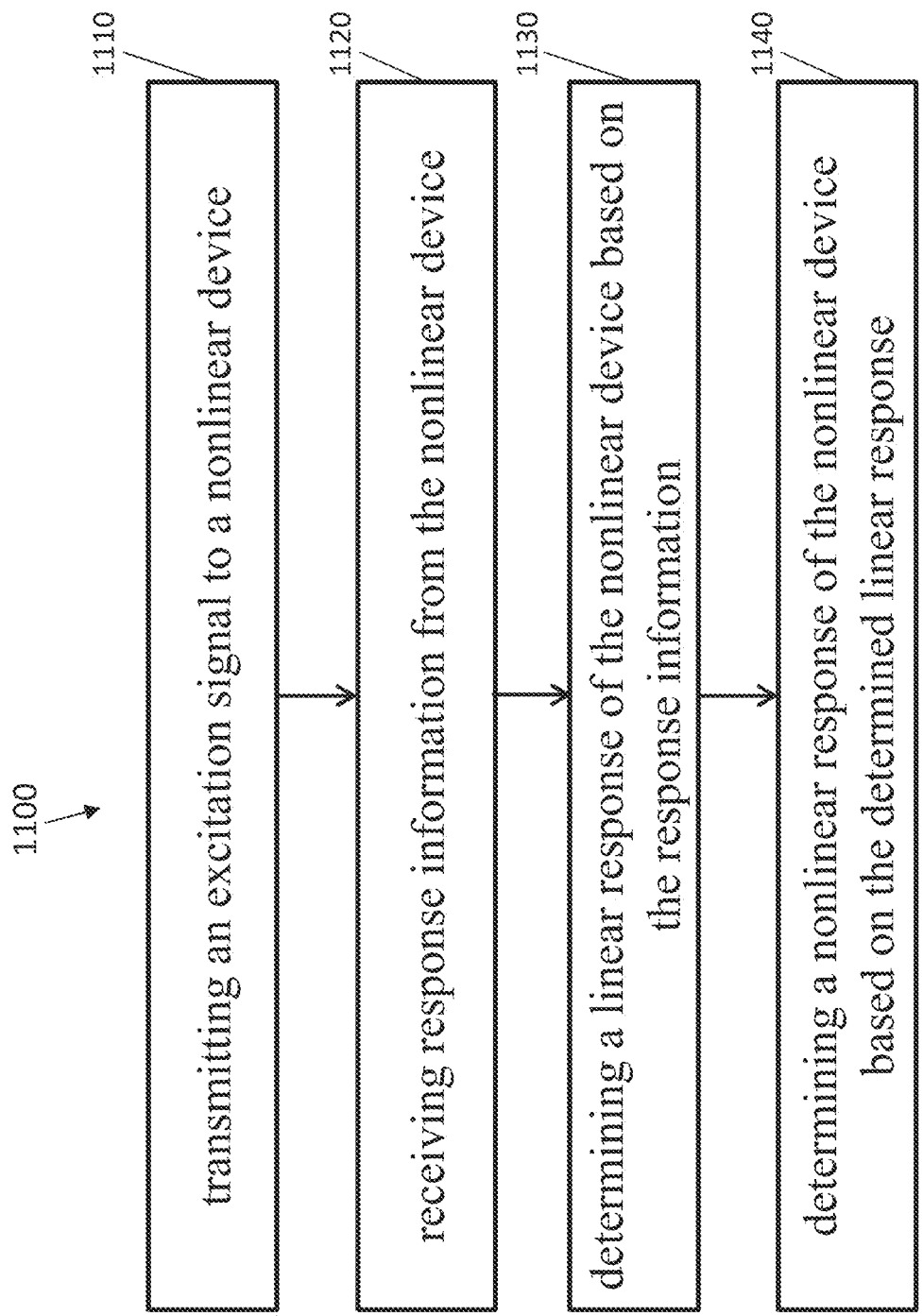
FIG. 11 shows an example of a method.

More details and aspects are mentioned in connection with the examples described above and/or below. The example shown in FIG. 8 may comprise one or more optional additional features corresponding to one or more aspects mentioned in connection with the proposed concept or one or more examples described above (e. g. FIGS. 1-7) and/or below (e. g. FIG. 9-11).

An example of an implementation using a digital-to-analog conversion system according to one or more aspects of the architecture described above or one or more examples described above is illustrated in FIG. 9. FIG. 9 schematically illustrates an example of a radio base station 900 (e.g. for a femtocell, a picocell, a microcell or a macrocell) comprising a processing device 920 as proposed.

The processing device is part of a transmitter 910. The processing device 930 (e.g., a DSP) may be configured to supply a pre-distorted digital signal to a nonlinear device 920. The base station 910 additionally comprises a nonlinear system, e.g., a digital-to-analog conversion system 920. For example, the processing device 930 may be configured to generate the predistorted digital signal based on data to be wirelessly transmitted.

Further, the base station 900 comprises at least one antenna element 950 coupled to the transmitter 910 for radiating one or more RF transmission signals that are based on the DAC output to the environment. For example, the DAC of the digital-to-analog conversion system 920 may be coupled to the antenna element 950 via one or more intermediate elements such as a filter, an up-converter (mixer) or a PA.

Additionally, the base station 900 comprises a receiver 940 configured to receive a RF receive signal from the antenna element 950 or another antenna element (not illustrated) of the base station 900.

To this end, a base station enabling direct generation of an RF transmission signal by means of a DAC may be enabled. The proposed digital-to-analog conversion system 920 may allow for wideband DAC compensation with reduced complexity, (die) size, power consumption and cost.

The base station 900 may comprise further elements such as, e.g., a baseband processor, an application processor, memory, a network controller, a user interface, power management circuitry, a satellite navigation receiver, a network interface controller or power tee circuitry.

In some aspects, the application processor may include one or more Central Processing Unit (CPU) cores and one or more of cache memory, a Low-DropOut (LDO) voltage regulator, interrupt controllers, serial interfaces such as Serial Peripheral Interface (SPI), Inter-Integrated Circuit ($I^2C$) or universal programmable serial interface module, Real Time Clock (RTC), timer-counters including interval and watchdog timers, general purpose Input-Output (IO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

More details and aspects are mentioned in connection with the examples described above and/or below. The example shown in FIG. 8 may comprise one or more optional additional features corresponding to one or more aspects mentioned in connection with the proposed concept or one or more examples described above (e. g. FIGS. 1-7) and/or below (e. g. FIG. 10-11).

Another example of an implementation using a digital-to-analog conversion system according to one or more aspects of the architecture described above or one or more examples described above is illustrated in FIG. 10. FIG. 10 schematically illustrates an example of a mobile device 1000 (e.g. mobile phone, smartphone, tablet-computer, or laptop) comprising a processing device 1030 as proposed.

The processing device is part of a transmitter 1010. The processing device 1030 (e.g., a DSP) may be configured to supply a pre-distorted digital signal to a nonlinear device 1020. The transmitter 1010 additionally comprises a nonlinear system, e.g., a digital-to-analog conversion system 1020 comprising a DAC (the nonlinear device). For example, the processing device 1030 may be configured to generate the pre-distorted digital signal based on data to be wirelessly transmitted.

Further, the mobile device 1000 comprises at least one antenna element 1050 coupled to the transmitter 1010 for radiating one or more RF transmission signals that are based on the DAC output to the environment. For example, the DAC of the digital-to-analog conversion system 1020 may be coupled to the antenna element 1050 via one or more intermediate elements such as a filter, an up-converter (mixer) or a PA.

Additionally, the mobile device 1000 comprises a receiver 10040 configured to receive a RF receive signal from the antenna element 1050 or another antenna element (not illustrated) of the mobile device 1000.

To this end, a mobile device enabling direct generation of an RF transmission signal by means of a DAC may be enabled. The proposed digital-to-analog conversion system 1020 may allow for wideband DAC compensation with reduced complexity, (die) size, power consumption and cost.

The mobile device 1000 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

More details and aspects are mentioned in connection with the examples described above and/or below. The example shown in FIG. 10 may comprise one or more optional additional features corresponding to one or more aspects mentioned in connection with the proposed concept or one or more examples described above (e. g. FIGS. 1-9) and/or below (e. g. FIG. 11).

FIG. 11 shows an example of a method 1100. The method comprises transmitting 1110 an excitation signal to a nonlinear device and receiving 1120 response information from the nonlinear device. Further, the method comprises determining 1130 a linear response of the nonlinear device based on the response information and determining 1140 a nonlinear response of the nonlinear device based on the determined linear response.

More details and aspects are mentioned in connection with the examples described above. The example shown in FIG. 11 may comprise one or more optional additional features corresponding to one or more aspects mentioned in connection with the proposed concept or one or more examples described above (e. g. FIG. 1-10).

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

An example (e.g., example 1) relates to a processing device, comprising one or more interfaces configured to transmit information to a nonlinear device; and processing circuitry configured to control the one or more interfaces and to: transmit an excitation signal to the nonlinear device; receive response information from the nonlinear device; determine a linear response of the nonlinear device based on the response information; and determine a nonlinear response of the nonlinear device based on the determined linear response.

Another example (e.g., example 2) relates to a previously described example (e.g., example 1) wherein the processing circuitry is further configured to determine a predistortion function based on the determined nonlinear response.

Another example (e.g., example 3) relates to a previously described example (e.g., one of the examples 1-2) wherein the processing circuitry is further configured to: generate a pre-distorted digital signal based on the predistortion function; and transmit the pre-distorted digital signal to the nonlinear device to enable the nonlinear device to compensate nonlinear behavior.

Another example (e.g., example 4) relates to a previously described example (e.g., one of the examples 1-3) wherein the excitation signal is a small wideband signal.

Another example (e.g., example 5) relates to a previously described example (e.g., one of the examples 3-4) wherein the processing circuitry is further configured to receive a feedback signal for providing a feedback of the performance of the pre-distorted digital signal to the processing device from a feedback device and wherein a transmission rate of the feedback signal is lower than a transmission rate of pre-distorted digital signal.

An example (e.g., example 6) relates to a method, comprising transmitting an excitation signal to a nonlinear device; receiving response information from the nonlinear device; determining a linear response of the nonlinear device based on the response information; and determining a nonlinear response of the nonlinear device based on the determined linear response.

Another example (e.g., example 7) relates to a previously described example (e.g., example 6) further comprising determining a predistortion function based on the determined nonlinear response.

Another example (e.g., example 8) relates to a previously described example (e.g., one of the examples 6-7) generating a pre-distorted digital signal based on the predistortion function; and transmitting the pre-distorted digital signal to the nonlinear device to enable the nonlinear device to compensate nonlinear behavior.

Another example (e.g., example 9) relates to a previously described example (e.g., one of the examples 6-8) wherein the excitation signal is a small wideband signal.

Another example (e.g., example 10) relates to a previously described example (e.g., one of the examples 6-9) further comprising receiving a feedback signal for providing a feedback signal of the performance of the pre-distorted digital signal to the processing device from a feedback device and wherein a transmission rate of the feedback signal is lower than a transmission rate of the pre-distorted digital signal.

An example (e.g., example 11) relates to a transmitter, comprising: a processing device according to claim 1; and a nonlinear system, comprising: a nonlinear device configured to: receive a pre-distorted digital signal from the processing device; and generate an analog signal based on the pre-distorted digital signal; and a feedback loop for providing a digital feedback signal to the processing device, wherein the feedback loop comprises an analog-to-digital converter configured to generate the digital feedback signal based on the analog signal, and wherein a sample rate of the analog-to-digital converter is lower than a sample rate of the digital-to-analog converter.

Another example (e.g., example 12) relates to a previously described example (e.g., example 11) wherein the processing device is further configured to generate the predistortion function based on data to be wirelessly transmitted.

Another example (e.g., example 13) relates to a previously described example (e.g., one of the examples 11-12) wherein the nonlinear system is a digital-to-analog conversion system.

Another example (e.g., example 14) relates to a previously described example (e.g., one of the examples 11-12) further comprising a power amplifier coupled to the digital-to-analog converter and configured to amplify the analog signal for generating an amplified signal; wherein the feedback loop comprises an analog-to-digital converter configured to generate the digital feedback signal based on the amplified signal.

An example (e.g., example 15) relates to a base station, comprising: a transmitter (e.g., the transmitter of one of the examples 11-14) and at least one antenna element coupled to a nonlinear system.

Another example (e.g., example 16) relates to a previously described example (e.g., example 15) further comprising a receiver configured to receive a radio frequency receive signal from the antenna element.

An example (e.g., example 17) relates to a mobile device, comprising a transmitter (e.g., the transmitter of one of the examples 11-14).

Another example (e.g., example 18) relates to a previously described example (e.g., example 18) further comprising a receiver configured to receive a RF receive signal from the antenna element according to example 15.

An example (e.g., example 19) relates to a computer program having a program code for performing the method according to example 6-10, when the computer program is executed on a computer, a processor, or a programmable hardware component.

Another example (e.g., example 20) relates to a previously described example (e.g., example 13) wherein the sample rate of the ADC is at least 10 times lower than the sample rate of the DAC.

Another example (e.g., example 21) relates to a previously described example (e.g., example 20) wherein the sample rate of the ADC is at least 50 times lower than the sample rate of the DAC.

Another example (e.g., example 22) relates to a previously described example (e.g., one of the examples 20-21), wherein the feedback loop further comprises a filter with a fix cutoff frequency, wherein the filter is coupled between the DAC and the ADC.

Another example (e.g., example 23) relates to a previously described example (e.g., example 22), wherein the cutoff frequency is independent from an instantaneous value of the sample rate of the DAC.

Another example (e.g., example 24) relates to a previously described example (e.g., one of the examples 22-23), wherein the cutoff frequency is equal to half of a maximum value of the sample rate of the DAC.

Another example (e.g., example 25) relates to a previously described example (e.g., one of the examples 20-24), wherein an input bandwidth of the filter is equal to or higher than half of a maximum value of the sample rate of the DAC.

Another example (e.g., example 26) relates to a previously described example (e.g., one of the examples 20-25), wherein an input bandwidth of the ADC is equal to or higher than half of a maximum value of the sample rate of the DAC.

Another example (e.g., example 27) relates to a previously described example (e.g., one of the examples 20-26), wherein the ADC is configured to sample the analog signal at irregular time intervals, and wherein the sample rate of the ADC is constant on average.

Another example (e.g., example 28) relates to a previously described example (e.g., one of the examples 20-27), wherein the ADC is configured to: receive a clock signal; count a number of clock cycles; sample the analog signal every time the number of clock cycles is equal to a stored value; and update the stored value after sampling the analog output signal.

Another example (e.g., example 29) relates to a previously described example (e.g., examples 27), further comprising a clock divider circuit configured to receive a first clock signal and to divide the first clock signal with varying division factors in order to generate a second clock signal with varying clock cycles for the ADC, wherein the ADC is configured to sample the analog signal based on the second clock signal.

Another example (e.g., example 30) relates to a previously described example (e.g., one of the examples 20-26), wherein the ADC is configured to sample the analog output signal at regular time intervals.

Another example (e.g., example 31) relates to a previously described example (e.g., examples 30), wherein the ADC is configured to sample the analog output signal at regular time intervals if a control signal received by the ADC indicates that the analog output signal exhibits a predetermined signal condition.

Another example (e.g., example 32) relates to a previously described example (e.g., one of the examples 20-31), wherein the processing device is configured to determine, based on the pre-distorted digital signal and the digital feedback signal, a mathematical model of a transfer function of the DAC when operating at a maximum value of the sample rate.

Another example (e.g., example 33) relates to a previously described example (e.g., example 32), wherein the processing device is further configured to determine, based on the mathematical model of the transfer function of the DAC, a set of pre-distortion coefficients for generating the pre-distorted digital signal.

Another example (e.g., example 34) relates to a previously described example (e.g., example 32), wherein, if the sample rates of the pre-distorted digital signal and the DAC are lower than the maximum value of the sample rate of the DAC, the processing device is configured to upsample the pre-distorted digital signal to the maximum value of the sample rate of the DAC in order to generate an up-sampled pre-distorted digital signal, and wherein the processing device is configured to determine the mathematical model based on the up-sampled pre-distorted digital signal and the digital feedback signal.

Another example (e.g., example 35) relates to a previously described example (e.g., example 34), wherein the processing device is further configured to determine, based on the mathematical model and the up-sampled pre-distorted digital signal, an auxiliary feedback signal exhibiting a sample rate equal to the maximum value of the sample rate of the DAC.

Another example (e.g., example 36) relates to a previously described example (e.g., example 35), wherein the processing device is further configured to filter the auxiliary feedback signal with a cutoff frequency equal to half of the sample rate of the pre-distorted digital signal.

Another example (e.g., example 37) relates to a previously described example (e.g., example 36), wherein the processing device is further configured to further down-sample the auxiliary feedback signal after filtering to obtain a down-sampled auxiliary feedback signal exhibiting the sample rate of the pre-distorted digital signal.

Another example (e.g., example 38) relates to a previously described example (e.g., example 37), wherein the processing device is further configured to determine, based on the pre-distorted digital signal and the down-sampled auxiliary feedback signal, a set of pre-distortion coefficients for generating the pre-distorted digital signal.

Another example (e.g., example 39) relates to a previously described example (e.g., one of the examples 20-38) further comprising: a power amplifier coupled to the DAC and configured to amplify the analog signal for generating an amplified signal; and a second feedback loop for providing a second digital feedback signal to the processing device, wherein the feedback loop comprises a second ADC configured to generate the second digital feedback signal based on the amplified signal, and wherein a sample rate of the second ADC is lower than a sample rate of the DAC.

Another example (e.g., example 40) relates to a previously described example (e.g., example 39), wherein the second feedback loop further comprises a second filter with the fix cutoff frequency, wherein the second filter is coupled between the power amplifier and the second ADC.

Another example (e.g., example 41 relates to a previously described example (e.g., example 39 or 40), wherein the processing device is configured to determine, based on the pre-distorted digital signal and the second digital feedback signal, a mathematical model of a transfer function of the power amplifier.

Another example (e.g., example 42) relates to a previously described example (e.g., example 41), wherein the processing device is further configured to determine, based on the mathematical model of the transfer function of the power amplifier, a set of pre-distortion coefficients for generating the pre-distorted digital signal.

Another example (e.g., example 43) relates to a previously described example (e.g., example 14) wherein the feedback loop further comprises a filter with a fix cutoff frequency, wherein the filter is coupled between the power amplifier and the ADC.

Another example (e.g., example 44) relates to a previously described example (e.g., example 43) the cutoff frequency is independent from an instantaneous value of the sample rate of the DAC.

Another example (e.g., example 45) relates to a previously described example (e.g., example 43 or 44), wherein the ADC is configured to sample the amplified signal at irregular time intervals, and wherein the sample rate of the ADC is on average constant.

Another example (e.g., example 46) relates to a previously described example (e.g., one of the examples 43-45)

wherein the processing device is configured to determine, based on the pre-distorted digital signal and the digital feedback signal, a mathematical model of the transfer functions of the DAC and the power amplifier.

Another example (e.g., example 47) relates to a previously described example (e.g., example 46) wherein the processing device is further configured to determine, based on the mathematical model of the transfer functions of the DAC, a set of pre-distortion coefficients for generating the pre-distorted digital signal.

Another example (e.g., example 48) relates to a previously described example (e.g., one of the examples 1-5) wherein the processing circuitry is further configured to receive a training feedback signal for providing a feedback of the response of the nonlinear device to the processing device from a feedback device and wherein a transmission rate of the training feedback signal is lower than a transmission rate of the excitation signal.

Another example (e.g., example 49) relates to a previously described example (e.g., one of the examples 6-10) further comprising receiving a training feedback signal for providing a feedback of the response of the nonlinear device to the processing device from a feedback device and wherein a transmission rate of the training feedback signal is lower than a transmission rate of the excitation signal.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A processing device, comprising
one or more interfaces configured to transmit information to a nonlinear device; and
processing circuitry configured to control the one or more interfaces and to:
transmit an excitation signal to the nonlinear device;
receive response information from the nonlinear device;
determine a linear response of the nonlinear device based on the response information;
determine a nonlinear response of the nonlinear device based on the determined linear response; and
receive a training feedback signal for providing a feedback of the response of the nonlinear device to the processing device from a feedback device, wherein a transmission rate of the training feedback signal is lower than a transmission rate of the excitation signal.

2. The processing device according to claim 1, wherein the processing circuitry is further configured to determine a predistortion function based on the determined nonlinear response.

3. The processing device according to claim 2, wherein the processing circuitry is further configured to:
generate a pre-distorted digital signal based on the pre-distortion function; and
transmit the pre-distorted digital signal to the nonlinear device to enable the nonlinear device to compensate nonlinear behavior.

4. The processing device according to claim 3, wherein the processing circuitry is further configured to receive a feedback signal for providing a feedback of the performance of the pre-distorted digital signal to the processing device from a feedback device and wherein a transmission rate of the feedback signal is lower than a transmission rate of pre-distorted digital signal.

5. The processing device according to claim 1, wherein the excitation signal is a small wideband signal.

6. A transmitter, comprising:
a processing device comprising processing circuitry, the processing device configured to:
transmit an excitation signal to a nonlinear device;
receive response information from the nonlinear device;
determine a linear response of the nonlinear device based on the response information; and
determine a nonlinear response of the nonlinear device based on the determined linear response; and
a nonlinear system, comprising:
the nonlinear device configured to:
receive a pre-distorted digital signal from the processing device; and
generate an analog signal based on the pre-distorted digital signal; and
a feedback loop for providing a digital feedback signal to the processing device, wherein the feedback loop comprises an analog-to-digital converter configured to generate the digital feedback signal based on the analog signal, and wherein a sample rate of the analog-to-digital converter is lower than a sample rate of the digital-to-analog converter.

7. The transmitter of claim 6, wherein the processing device is further configured to generate the predistortion function based on data to be wirelessly transmitted.

8. The transmitter of claim 6, wherein the nonlinear system is a digital-to-analog conversion system.

9. The transmitter of claim 6, further comprising
a power amplifier coupled to the digital-to-analog converter and configured to amplify the analog signal for generating an amplified signal; wherein
the feedback loop comprises an analog-to-digital converter configured to generate the digital feedback signal based on the amplified signal.

10. A base station, comprising:
a transmitter according to claim 6; and
at least one antenna element coupled to the nonlinear system.

11. The base station of claim 10, further comprising a receiver configured to receive a radio frequency receive signal from the antenna element.

12. A mobile device, comprising a transmitter according to claim 6.

13. The mobile device of claim 12, further comprising a receiver configured to receive a RF receive signal from an antenna element coupled to a nonlinear system.

14. A method, comprising
transmitting an excitation signal to a nonlinear device;
receiving response information from the nonlinear device;
determining a linear response of the nonlinear device based on the response information;
determining a nonlinear response of the nonlinear device based on the determined linear response; and receiving a training feedback signal for providing a feedback of the response of the nonlinear device to the processing device from a feedback device, wherein a transmission rate of the training feedback signal is lower than a transmission rate of the excitation signal.

15. The method according to claim 14, further comprising determining a predistortion function based on the determined nonlinear response.

16. The method according to claim 15, further comprising
generating a pre-distorted digital signal based on the predistortion function; and
transmitting the pre-distorted digital signal to the nonlinear device to enable the nonlinear device to compensate nonlinear behavior.

17. The method according to claim 16, further comprising
receiving a feedback signal for providing a feedback signal of the performance of the pre-distorted digital signal to the processing device from a feedback device and wherein a transmission rate of the feedback signal is lower than a transmission rate of the pre-distorted digital signal.

18. The method according to claim 14, wherein the excitation signal is a small wideband signal.

19. A non-transitory, computer-readable medium comprising a program code that, when the program code is executed on a computer, a processor, or a programmable hardware component, performs the method according to claim 14.

* * * * *